(12) United States Patent
Mohan et al.

(10) Patent No.: US 10,818,998 B2
(45) Date of Patent: *Oct. 27, 2020

(54) SPATIAL POWER-COMBINING DEVICES WITH FILTERING ELEMENTS

(71) Applicant: Qorvo US, Inc., Greensboro, NC (US)

(72) Inventors: Ankush Mohan, Thousand Oaks, CA (US); Dan Denninghoff, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/933,821

(22) Filed: Mar. 23, 2018

(65) Prior Publication Data

US 2019/0067783 A1 Feb. 28, 2019

Related U.S. Application Data

(60) Provisional application No. 62/548,457, filed on Aug. 22, 2017, provisional application No. 62/548,447, (Continued)

(51) Int. Cl.
*H01P 5/12* (2006.01)
*H03F 3/195* (2006.01)
(Continued)

(52) U.S. Cl.
CPC .................. *H01P 5/12* (2013.01); *H01P 1/22* (2013.01); *H01P 3/06* (2013.01); *H01P 5/107* (2013.01);
(Continued)

(58) Field of Classification Search
CPC .. H01Q 21/0006; H01Q 21/0025; H03F 3/19; H03F 3/195; H03F 3/211;
(Continued)

(56) References Cited

U.S. PATENT DOCUMENTS 3,023,382 A 2/1962 Borghetti
4,234,854 A 11/1980 Schellenberg et al.
(Continued)

FOREIGN PATENT DOCUMENTS

WO 2017214357 A2 12/2017

OTHER PUBLICATIONS

Non-Final Office Action for U.S. Appl. No. 15/637,472, dated Aug. 10, 2018, 8 pages.
(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Spatial power-combining devices and, in particular, spatial power-combining devices with filtering elements are disclosed. A spatial power-combining device includes a plurality of amplifier assemblies and each amplifier assembly includes an input antenna structure, an amplifier, an output antenna structure, and a filtering element. A filtering element may be an integral single component with an input signal conductor of the input antenna structure or an integral single component with an output signal conductor of the output antenna structure. In some aspects, a filtering element may be an integral single component with both the input signal conductor and the output signal conductor.

23 Claims, 11 Drawing Sheets

Related U.S. Application Data filed on Aug. 22, 2017, provisional application No. 62/548,448, filed on Aug. 22, 2017, provisional application No. 62/548,472, filed on Aug. 22, 2017, provisional application No. 62/548,464, filed on Aug. 22, 2017.

(51) Int. Cl.

| | | |
|---|---|---|
| *H01P 3/06* | (2006.01) | |
| *H01Q 1/50* | (2006.01) | |
| *H01Q 21/00* | (2006.01) | |
| *H01Q 13/08* | (2006.01) | |
| *H04B 7/06* | (2006.01) | |
| *H01P 5/107* | (2006.01) | |
| *H03F 3/19* | (2006.01) | |
| *H03F 3/21* | (2006.01) | |
| *H04B 1/04* | (2006.01) | |
| *H01P 1/22* | (2006.01) | |
| *H03H 11/04* | (2006.01) | |

(52) U.S. Cl.
CPC .............. *H01Q 1/50* (2013.01); *H01Q 13/08* (2013.01); *H01Q 21/0006* (2013.01); *H01Q 21/0025* (2013.01); *H03F 3/19* (2013.01); *H03F 3/195* (2013.01); *H03F 3/211* (2013.01); *H03H 11/04* (2013.01); *H04B 1/0458* (2013.01); *H04B 7/0613* (2013.01); *H03F 2200/315* (2013.01); *H03F 2200/451* (2013.01); *H03H 2011/0488* (2013.01)

(58) Field of Classification Search
CPC ........ H03F 2200/315; H03F 2200/451; H03H 11/04; H03H 2011/0488; H04B 1/0458; H04B 7/0613
USPC ........................................................ 333/126
See application file for complete search history.

(56) References Cited

U.S. PATENT DOCUMENTS

| | | |
|---|---|---|
| 4,424,496 A | 1/1984 | Nichols et al. |
| 5,036,335 A | 7/1991 | Jairam |
| 5,162,803 A | 11/1992 | Chen |
| 5,214,394 A | 5/1993 | Wong |
| 5,256,988 A | 10/1993 | Izadian |
| 5,736,908 A | 4/1998 | Alexanian et al. |
| 5,920,240 A | 7/1999 | Alexanian et al. |
| 6,028,483 A | 2/2000 | Shealy et al. |
| 6,037,840 A | 3/2000 | Myer |
| 6,181,221 B1 | 1/2001 | Kich et al. |
| 6,828,875 B2 | 12/2004 | Channabasappa et al. |
| 7,110,165 B2 | 9/2006 | Martin et al. |
| 7,215,220 B1 | 5/2007 | Jia |
| 7,466,203 B2 | 12/2008 | Rector |
| 8,698,577 B2 | 4/2014 | Sherrer et al. |
| 8,928,429 B2 | 1/2015 | Song et al. |
| 9,019,036 B2 | 4/2015 | Kolias et al. |
| 9,054,427 B2 | 6/2015 | Guy et al. |
| 9,065,163 B1 | 6/2015 | Wu et al. |
| 9,276,304 B2 | 3/2016 | Behan et al. |
| 9,287,605 B2 | 3/2016 | Daughenbaugh, Jr. et al. |
| 9,325,074 B2 | 4/2016 | Chandler |
| 9,917,343 B2 | 3/2018 | Chieh et al. |
| 9,954,706 B1 | 4/2018 | Harris et al. |
| 10,003,118 B2 | 6/2018 | Kitt |
| 10,009,067 B2 | 6/2018 | Birk et al. |
| 10,164,667 B1 | 12/2018 | Kitt |
| 2006/0202777 A1 | 9/2006 | Deckman et al. |
| 2007/0229186 A1 | 10/2007 | Hacker et al. |
| 2007/0279146 A1 | 12/2007 | Rector |
| 2014/0145794 A1 | 5/2014 | Courtney et al. |
| 2014/0167880 A1 | 6/2014 | Daughenbaugh, Jr. et al. |
| 2017/0149113 A1 | 5/2017 | Theveneau et al. |
| 2017/0179598 A1 | 6/2017 | Kitt |
| 2018/0294539 A1 | 10/2018 | Kitt |
| 2019/0007007 A1 | 1/2019 | Kitt |
| 2019/0067778 A1 | 2/2019 | Mohan |
| 2019/0067781 A1 | 2/2019 | Mohan et al. |
| 2019/0067782 A1 | 2/2019 | Mohan et al. |
| 2019/0067836 A1 | 2/2019 | Mohan |
| 2019/0068123 A1 | 2/2019 | Mohan et al. |
| 2019/0068140 A1 | 2/2019 | Mohan et al. |
| 2019/0068141 A1 | 2/2019 | Yoon et al. |

OTHER PUBLICATIONS

Notice of Allowance for U.S. Appl. No. 15/927,565, dated Aug. 8, 2018, 8 pages.

Author Unknown, "Interpack 2005: An assessment for PMMI members," 2005, PMMI, 32 pages.

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.

Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.

Larkins, Grover, et al., "Evidence of Superconductivity in Doped Graphite and Graphene," Superconductor Science and Technology, vol. 29, Issue 1, Dec. 2015, IOP Publishing Ltd, 18 pages.

Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.

Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.

Smalc, Martin, et al., "Thermal Performance of Natural Graphite Heat Spreaders," Proceedings of IPACK2005, Jul. 17-22, San Francisco, California, American Society of Mechanical Engineers, 11 pages.

Notice of Allowance for U.S. Appl. No. 15/637,472, dated Mar. 12, 2019, 7 pages.

Non-Final Office Action for U.S. Appl. No. 15/846,840, dated Mar. 21, 2019, 4 pages.

Notice of Allowance for U.S. Appl. No. 15/845,225, dated Jan. 10, 2019, 7 pages.

Notice of Allowance for U.S. Appl. No. 16/166,548, dated Nov. 29, 2018, 8 pages.

Non-Final Office Action for U.S. Appl. No. 15/981,516, dated Jul. 17, 2019, 5 pages.

Non-Final Office Action for U.S. Appl. No. 15/933,783, dated May 1, 2019, 8 pages.

Non-Final Office Action for U.S. Appl. No. 16/042,351, dated Jul. 5, 2019, 5 pages.

Notice of Allowance for U.S. Appl. No. 15/846,840, dated Jul. 5, 2019, 7 pages.

Non-Final Office Action for U.S. Appl. No. 15/981,535, dated Jul. 8, 2019, 5 pages.

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

(56) References Cited

OTHER PUBLICATIONS

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A., et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Montgomery, R., et al., "Solid-State PAs Battle TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 16/005,794, dated Oct. 7, 2019, 11 pages.

Notice of Allowance for U.S. Appl. No. 16/042,351, dated Nov. 18, 2019, 7 pages.

Non-Final Office Action for U.S. Appl. No. 16/008,586, dated Oct. 24, 2019, 10 pages.

Non-Final Office Action for U.S. Appl. No. 16/191,541, dated Dec. 9, 2019, 7 pages.

Corrected Notice of Allowance and Examiner-Initiated Interview Summary for U.S. Appl. No. 15/846,840, dated Dec. 12, 2019, 6 pages.

Notice of Allowance for U.S. Appl. No. 16/005,794, dated Jan. 9, 2020, 7 pages.

Non-Final Office Action for U.S. Appl. No. 16/032,252, dated Dec. 27, 2019, 5 pages.

Notice of Allowance for U.S. Appl. No. 16/008,586, dated Feb. 4, 2020, 8 pages.

Corrected Notice of Allowance and Applicant-Initiated Interview Summary for U.S. Appl. No. 15/846,840, dated Dec. 31, 2019, 6 pages.

Notice of Allowance for U.S. Appl. No. 15/981,535, dated Dec. 31, 2019, 7 pages.

Non-Final Office Action for U.S. Appl. No. 16/039,435, dated Jan. 7, 2020, 5 pages.

Notice of Allowance for U.S. Appl. No. 15/981,516, dated Jan. 15, 2020, 7 pages.

Final Office Action for U.S. Appl. No. 16/191,541, dated Mar. 31, 2020, 8 pages.

Corrected Notice of Allowability and Examiner-Initiated Interview Summary for U.S. Appl. No. 16/005,794, dated May 26, 2020, 6 pages.

Notice of Allowance for U.S. Appl. No. 16/032,252, dated Jun. 1, 2020, 7 pages.

Notice of Allowance for U.S. Appl. No. 16/039,435, dated Jun. 17, 2020, 8 pages.

Notice of Allowance for U.S. Appl. No. 16/214,234, dated May 15, 2020, 8 pages.

Non-Final Office Action for U.S. Appl. No. 16/288,735, dated May 26, 2020, 9 pages.

Advisory Action, Examiner-Initiated Interview Summary, and AFCP 2.0 Decision for U.S. Appl. No. 16/191,451, dated May 21, 2020, 5 pages.

Notice of Allowance for U.S. Appl. No. 16/191,541, dated Jul. 9, 2020, 7 pages.

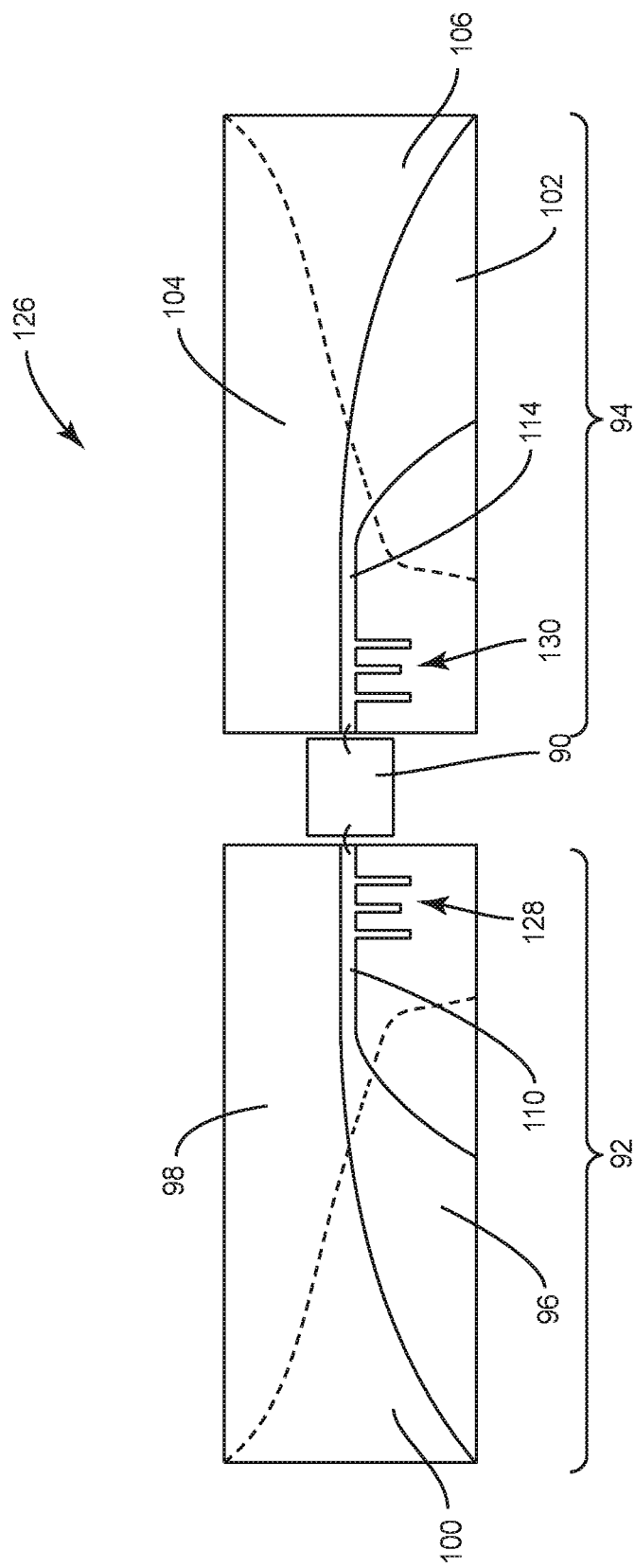

SPATIAL POWER-COMBINING DEVICES WITH FILTERING ELEMENTS

This application claims the benefit of U.S. provisional patent application Ser. Nos. 62/548,447, 62/548,448, 62/548,457, 62/548,464, and 62/548,472, all of which were filed on Aug. 22, 2017, the disclosures of which are incorporated herein by reference in their entireties.

RELATED APPLICATION

The present application is related to U.S. patent application Ser. No. 15/933,783, filed on Mar. 23, 2018, entitled "AMPLIFIER ASSEMBLIES WITH MULTIPLE ANTENNA STRUCTURES AND AMPLIFIERS," now U.S. Pat. No. 10,615,482, which is incorporated herein by reference in its entirety.

FIELD OF THE DISCLOSURE

The disclosure relates generally to spatial power-combining devices and, more particularly, to spatial power-combining devices with filtering elements.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, the input antennas may form an input antipodal antenna array, and the output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

The output power and frequency of a spatial power-combining device is related to the power and frequency of an input signal as well as the total number of amplifiers present. Each amplifier receives and amplifies a split portion of the input signal and thereby provides a portion of an overall amplified output signal. Noise or other unwanted frequency components of the input signal that are outside of a desired operating range are also amplified by the spatial power-combining device.

SUMMARY

Aspects disclosed herein include spatial power-combining devices, and in particular, spatial power-combining devices with filtering elements. A spatial power-combining device includes a plurality of amplifier assemblies and each amplifier assembly includes an input antenna structure, an amplifier, and an output antenna structure. A filtering element may be an integral single component with an input signal conductor of the input antenna structure or an integral single component with an output signal conductor of the output antenna structure. In some aspects, a filtering element may be an integral single component with both the input signal conductor and the output signal conductor.

In this regard, in one aspect, a spatial power-combining device for modifying a signal comprises a plurality of amplifier assemblies, wherein each amplifier assembly of the plurality of amplifier assemblies comprises an amplifier, an input antenna structure comprising an input signal conductor and an input ground conductor, an output antenna structure comprising an output signal conductor and an output ground conductor, and a first filter element that is an integral single component with at least one of the input signal conductor and the output signal conductor. In some aspects, the amplifier includes a Monolithic Microwave Integrated Circuit (MMIC) amplifier. In some aspects, the first filter element includes at least one of a low-pass filter, a high-pass filter, a band-pass filter, and a band-stop filter. In some aspects, the input signal conductor includes an input connector portion, the output signal conductor includes an output connector portion, and the filter element is an integral single component with at least one of the input connector portion and the output connector portion.

In some aspects, a spatial power-combining device for modifying a signal comprises a plurality of amplifier assemblies, wherein each amplifier assembly of the plurality of amplifier assemblies comprises a first amplifier sub-assembly and a second amplifier sub-assembly. The first amplifier sub-assembly comprises a first amplifier, a first input antenna structure coupled to the first amplifier and comprising a first input signal conductor, a first output antenna structure coupled to the first amplifier, and a first filter element that is an integral single component with the first input signal conductor. The second amplifier sub-assembly comprises a second amplifier, a second input antenna structure coupled to the second amplifier and comprising a second input signal conductor, a second output antenna structure coupled to the second amplifier, and a second filter element that is an integral single component with the second input signal conductor.

In some aspects, a spatial power-combining device for modifying a signal comprises a plurality of amplifier assemblies, wherein each amplifier assembly comprises an amplifier, an input antenna structure comprising an input signal conductor and an input ground conductor that are separated by air, an output antenna structure comprising an output signal conductor and an output ground conductor that are separated by air, and a first filter element that is an integral single component with at least one of the input signal conductor and the output signal conductor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a partially-exploded perspective view of a representative spatial power-combining device according to some embodiments;

FIG. 5D is a plan view of an amplifier sub-assembly according to some embodiments;

DETAILED DESCRIPTION

Figure 1:
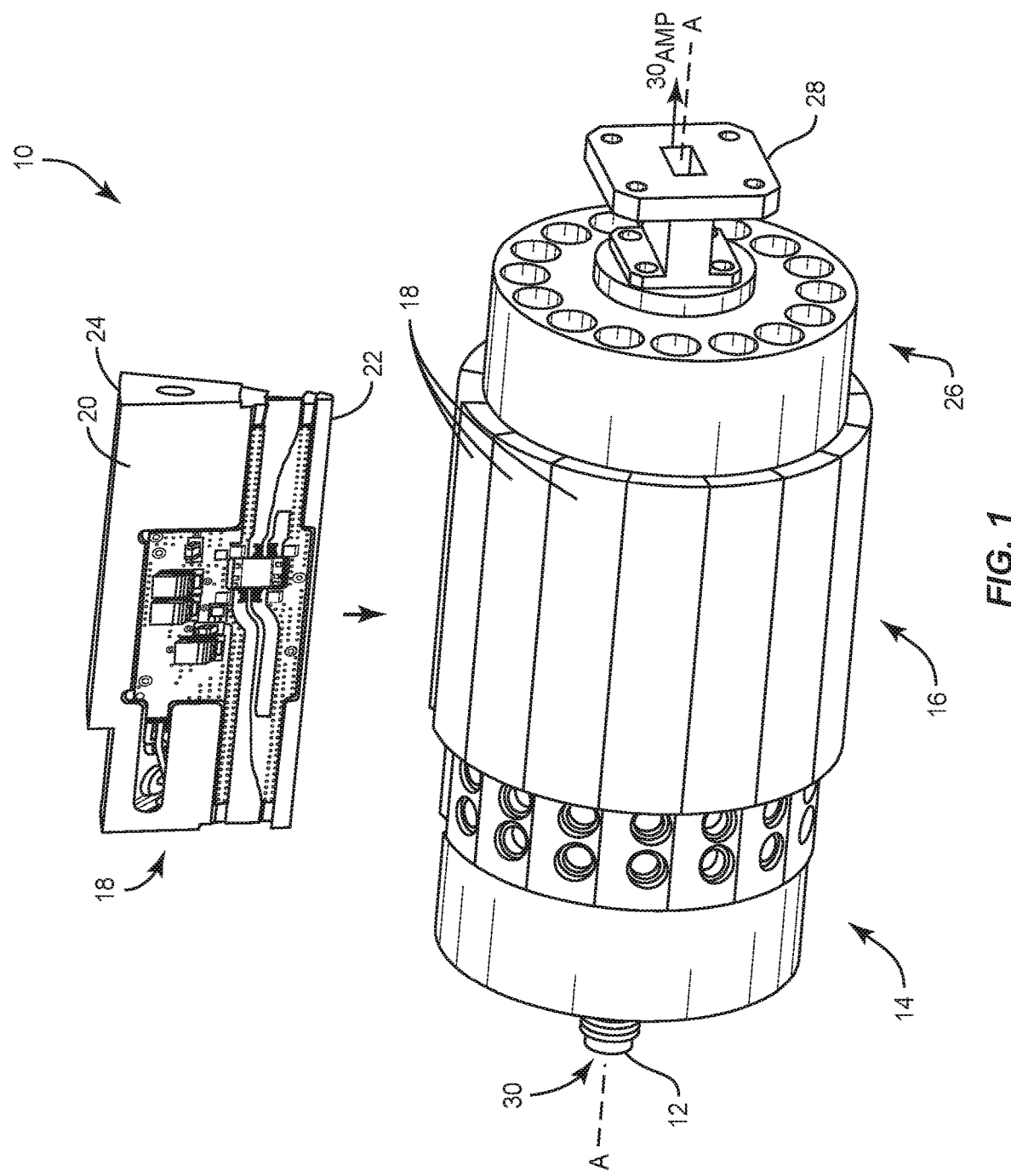

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include spatial power-combining devices, and in particular, spatial power-combining devices with filtering elements. A spatial power-combining device includes a plurality of amplifier assemblies, and each amplifier assembly includes an input antenna structure, an amplifier, and an output antenna structure. A filtering element may be an integral single component with an input signal conductor of the input antenna structure or an integral single component with an output signal conductor of the output antenna structure. In some aspects, a filtering element may be an integral single component with both the input signal conductor and the output signal conductor.

The embodiments are particularly adapted to spatial power-combining devices that operate at microwave frequencies such as, by way of non-limiting example, energy between about 300 megahertz (MHz) (100 centimeters (cm) wavelength) and 300 gigahertz (GHz) (0.1 cm wavelength). Additionally, embodiments may comprise operating frequency ranges that extend above microwave frequencies. A spatial power-combining device may operate within one or more common radar bands including, but not limited to S-band, C-band, X-band, Ku-band, K-band, Ka-band, and Q-band. In some embodiments, by way of non-limiting examples, the operating frequency range includes an operating bandwidth spread of 2 GHz to 20 GHz. In other embodiments, the operating frequency range includes an operating bandwidth spread of 4 GHz to 41 GHz.

A spatial power-combining device generally includes a plurality of amplifier assemblies, and each amplifier assembly includes an amplifier sub-assembly. The amplifier sub-assembly includes an amplifier connected to an input antenna structure and an output antenna structure to provide an individual signal path. An input coaxial waveguide section is configured to provide a signal concurrently to each input antenna structure, and an output coaxial waveguide section is configured to concurrently combine the amplified signals from each output antenna structure. The plurality of amplifier assemblies are arranged coaxially about a center axis. Accordingly, the spatial power-combining device is configured to split, amplify, and combine an electromagnetic signal. Output power and frequency of the spatial power-combining device is related to power and frequency of an input signal as well as a total number of amplifiers present. Noise or other unwanted frequency components of the input signal that are outside of a desired operating range are also amplified by the spatial power-combining device.

In that regard, some aspects include a spatial power-combining device that includes a plurality of amplifier assemblies and each amplifier assembly includes a filtering element configured to limit frequencies allowed to pass to each amplifier. Each amplifier assembly includes an input antenna structure, an amplifier, and an output antenna structure. A filtering element may be an integral single component with an input signal conductor of the input antenna structure or an integral single component with an output signal conductor of the output antenna structure. In some aspects, a filtering element may be an integral single component with both the input signal conductor and the output signal conductor. In that regard, a spatial power-combining device is configured to be self-filtering and may only amplify desired signal frequencies.

FIG. 1 is a partially-exploded perspective view of a representative spatial power-combining device 10 according to some embodiments. The spatial power-combining device 10 comprises an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16.

The center waveguide section 16 comprises a plurality of amplifier assemblies 18 arranged radially around a center axis A of the spatial power-combining device 10. Each amplifier assembly 18 comprises a body 20 having a pre-determined wedge-shaped cross-section, an inner surface 22, and an arcuate outer surface 24. When the amplifier assemblies 18 are collectively assembled radially about the center axis A, they may form the center waveguide section 16 with a generally cylindrical shape; however, other shapes are possible, such as rectangular, oval, or other geometric shapes.

The spatial power-combining device 10 also comprises an output coaxial waveguide section 26 and an output port 28. The input port 12 and the output port 28 may be field-replaceable Subminiature A (SMA) connectors. In other embodiments, the input port 12 and the output port 28 may be super SMA connectors, type N connectors, K connectors, or any other suitable connectors. The output coaxial waveguide section 26 provides a broadband transition from the center waveguide section 16 to the output port 28. Electrically, the output coaxial waveguide section 26 provides broadband impedance matching from the impedance $Z_c$ of the center waveguide section 16 to an impedance $Z_{p2}$ of the output port 28. The input port 12 is configured to receive an input signal 30 and the output port 28 is configured to output an amplified signal $30_{AMP}$.

The input coaxial waveguide section 14 is configured to receive the input signal 30 from the input port 12 and concurrently provide the input signal 30 to each amplifier assembly 18 of the plurality of amplifier assemblies 18. The output coaxial waveguide section 26 is configured to concurrently combine amplified signals transmitted from each amplifier assembly 18 of the plurality of amplifier assemblies 18 to output the amplified signal $30_{AMP}$ through the output port 28.

Figure 2:
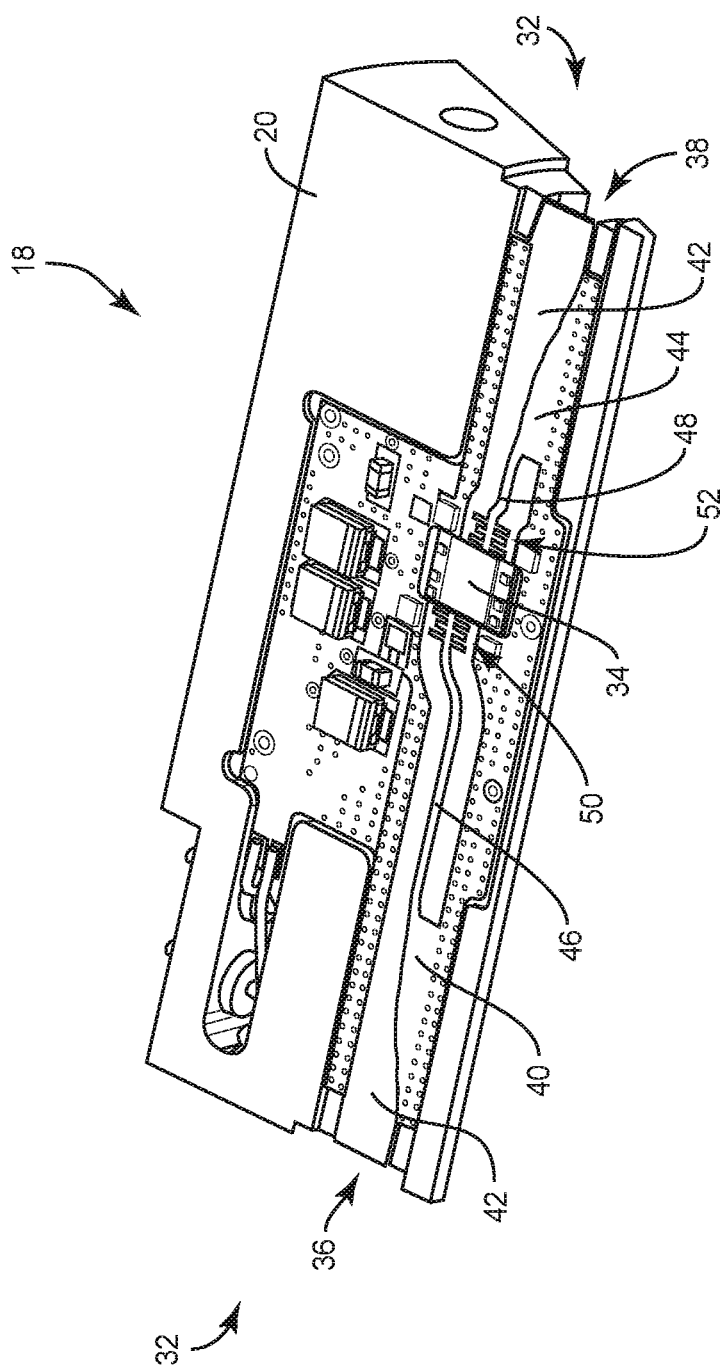
FIG. 2 is a perspective view of the amplifier assembly of FIG. 1 according to some embodiments.

FIG. 2 is a perspective view of the amplifier assembly 18 of FIG. 1 according to some embodiments. The amplifier assembly 18 comprises an amplifier sub-assembly 32. The amplifier sub-assembly 32 comprises an amplifier 34, an input antenna structure 36 coupled to the amplifier 34, and an output antenna structure 38 coupled to the amplifier 34. In some embodiments, the amplifier 34 comprises a first Monolithic Microwave Integrated Circuit (MMIC) amplifier. A MMIC may be a solid-state gallium nitride (GaN) based MMIC. A GaN MMIC device provides high power density and bandwidth, and a spatial power-combining device may combine power from a plurality of GaN MMICs efficiently in a single step to minimize combining loss.

The input antenna structure 36 comprises an input signal conductor 40 supported on a board 42, and the output antenna structure 38 comprises an output signal conductor 44 that is also supported on the board 42. The input signal conductor 40 comprises an input signal connector portion 46 that is coupled to the amplifier 34. Additionally, the output signal conductor 44 comprises an output signal connector portion 48 that is coupled to the amplifier 34. The board 42 may be a printed circuit board that provides a desired form factor and mechanical support for the input signal conductor 40 and the output signal conductor 44. As will be described later, the input antenna structure 36 also includes an input ground conductor on an opposing side of the board 42 to the input signal conductor 40 that is not visible in FIG. 2. In a similar manner, the output antenna structure 38 includes an output ground conductor on an opposing side of the board 42 to the output signal conductor 44 that is also not visible in FIG. 2. In other embodiments, the board 42 may be substituted with a plurality of boards.

In operation, the input antenna structure 36 receives a portion of the input signal 30 (FIG. 1) for transmission to the amplifier 34 via the input signal connector portion 46. The amplifier 34 outputs a portion of the amplified signal $30_{AMP}$ (FIG. 1) via the output signal connector portion 48 where it is transmitted through the output antenna structure 38 to the output coaxial waveguide section 26 (FIG. 1).

Any noise or other unwanted frequency components of the input signal 30 that are outside of a desired operating range may also be amplified. To reduce or eliminate such unwanted frequency components, the amplifier assembly 18 comprises a first filter element 50 that is electrically coupled to the input signal conductor 40. The first filter element 50 may be located between the input signal conductor 40 and the amplifier 34. In some embodiments, the first filter element 50 is separate from the input signal conductor 40 and in other embodiments, the first filter element 50 is an integral single component with the input signal conductor 40. In some embodiments, the input signal conductor 40 and the first filter element 50 are a continuous metal pattern deposited on the board 42. In some embodiments, the first filter element 50 is an integral single component with the input signal connector portion 46 of the input signal conductor 40. The first filter element 50 is configured to reflect or absorb noise or other unwanted frequency components of the input signal 30 before the input signal 30 reaches the amplifier 34. Accordingly, a first filter element 50 may be provided for each amplifier assembly 18 in a spatial power-combining device. For example, a spatial power-combining device with sixteen amplifier assemblies would have at least sixteen filter elements and a spatial power-combining device with eight amplifier assemblies would have at least eight filter elements. In other embodiments, the number of amplifier assemblies and filter elements may not be equal.

Accordingly, a spatial power-combining device including internal filters may be characterized as self-filtering. The spatial power-combining device would therefore amplify only desired or intended signal frequencies without a need for bulky external filters that add to system complexity and cost. Each filter element within a spatial power-combining device receives a split portion of an input signal and accordingly operates with lower power and lower heat dissipation requirements than an external filter.

The amplifier assembly 18 may comprise a second filter element 52 that is an integral single component with the output signal conductor 44. As with the input signal conductor 40, the output signal conductor 44 and the second filter element 52 may be a continuous metal pattern deposited on the board 42. In further embodiments, the second filter element 52 is an integral single component with the output signal connector portion 48 of the output signal conductor 44. In some embodiments, the amplifier assembly 18 comprises the first filter element 50 and the second filter element 52, while in other embodiments, either the first filter element 50 or the second filter element 52 may be omitted. For embodiments where the second filter element 52 is omitted, an incoming signal is filtered within the amplifier assembly 18 before being amplified. Conversely, in embodiments where the first filter element 50 is omitted, the amplified signal is filtered before propagating out of the amplifier assembly 18.

A filter element, as used herein, may include a low-pass filter, a high-pass filter, a band-pass filter, a band-stop filter, and combinations thereof. In general terms, a low-pass filter allows passage of low-frequency signals while attenuating passage of higher-frequency signals. Conversely, a high-pass filter allows passage of high-frequency signals while attenuating passage of lower-frequency signals. A band-pass filter allows passage of a certain range of frequencies while attenuating passage of other frequencies outside of that range. Conversely, a band-stop filter attenuates frequencies of a certain range while allowing passage of other frequencies outside of that range. As previously described, a spatial power-combining device may be particularly suited for operation at microwave frequencies, such as, by way of non-limiting example, energy between about 300 MHz (100 cm wavelength) and 300 GHz (0.1 cm wavelength). Additionally, a spatial power-combining device may comprise operating frequency ranges that extend above microwave frequencies. A spatial power-combining device may operate within one or more common radar bands including, but not limited to S-band, C-band, X-band, Ku-band, K-band, Ka-band, and Q-band. For example, some operating frequency ranges for spatial power-combining devices include 2 to 6 GHz, 2 to 7.5 GHz, 2 to 18 GHz, 2 to 20 GHz, 4 GHz to 41 GHz, and 27 to 31 GHz, among others. In that regard, a filtering element as described herein is incorporated into the amplifier assembly to attenuate frequencies above, below, or both above and below a desired operating range. Accordingly, any noise or other unwanted frequency components of an input signal may not be part of an amplified output signal of a spatial power-combining device.

Figure 3A:
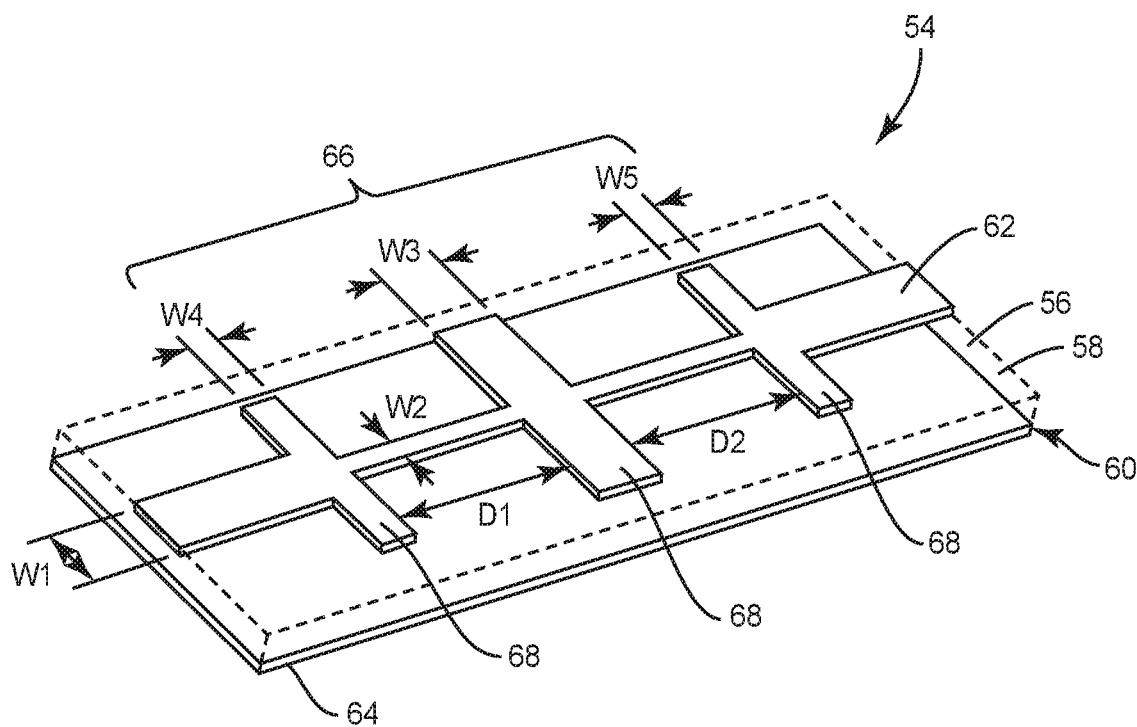
FIG. 3A is a perspective view of a portion of an antenna structure according to some embodiments.

FIG. 3A is a perspective view of a portion of an antenna structure 54 according to some embodiments. It is understood the portion of the antenna structure 54 may be either a portion of an input antenna structure or a portion of an output antenna structure of an amplifier assembly. The portion of the antenna structure 54 includes a board 56 as previously described that includes a first face 58 and a second face 60 that generally opposes the first face 58. A signal conductor 62 is on the first face 58, and a ground conductor 64 is on the second face 60. A filter element 66 is an integral single component with the signal conductor 62. The filter element 66 includes a plurality of stubs 68 that are continuous with and protrude from the signal conductor 62 along the first face 58. In FIG. 3A, the plurality of stubs 68 are configured to be a low-pass filter and extend along the first face 58 in opposing directions from the signal conductor 62.

Stubs are integral with a signal conductor to attenuate frequencies outside of a desired operating range. Length, width, height, spacing, position, and number of stubs are configured to reflect or absorb unwanted frequencies propagating through the signal conductor. In some embodiments, a stub is configured with a length that is equal to a quarter wavelength of the frequency the stub is intended to attenuate. Accordingly, a length of each stub 68 of the plurality of stubs 68 may be equal to a quarter wavelength of the frequency each stub 68 is configured to attenuate. In some embodiments, a stub is spaced from another stub by a distance equal to a quarter wavelength of the frequency the stub is intended to attenuate. Accordingly, each stub 68 of the plurality of stubs 68 may be spaced from another stub 68 of the plurality of stubs 68 by a distance equal to a quarter wavelength of the frequency each stub 68 is configured to attenuate. In some embodiments, the length and spacing of stubs 68 varies within the plurality of stubs 68 and accordingly, each stub 68 may attenuate a different frequency within the filter element 66. The number of stubs 68 is related to operating bandwidth. For example, a 4-18 GHz device may include three stubs 68, and a device with a wider bandwidth may include more than three stubs 68. The stubs 68 may be configured in a variety of shapes depending on the operating frequency and bandwidth. Accordingly, a stub may extend in a direction perpendicular to the rest of the signal conductor, while in other embodiments, a stub may extend in a non-perpendicular direction. In some embodiments, a longitudinal axis of each stub 68 of the plurality of stubs 68 extends perpendicular to the signal conductor 62, which may be an input signal conductor or an output signal conductor. In further embodiments, the plurality of stubs 68 extend perpendicular and in at least two directions from the signal conductor 62. A single filter element may include different stubs configured to attenuate different frequencies. By way of a non-limiting example, the portion of the antenna structure 54 of FIG. 3A has a width (W1) of about 23-25 mil for the signal conductor 62 outside of the filter element 66 and a width (W2) of about 7-8 mil for the signal conductor 62 within the filter element 66. The stubs 68 have widths of about 20-21 mil (W3) and about 10-11 mil (W4, W5) respectively, and are spaced apart by a distance of about 56-57 mil (D1, D2). Accordingly, all widths (W2, W3, W4, and W5) of the signal conductor 62 within the filter element 66 are smaller than the width (W1) of the signal conductor 62 outside of the filter element 66.

Figure 3B:
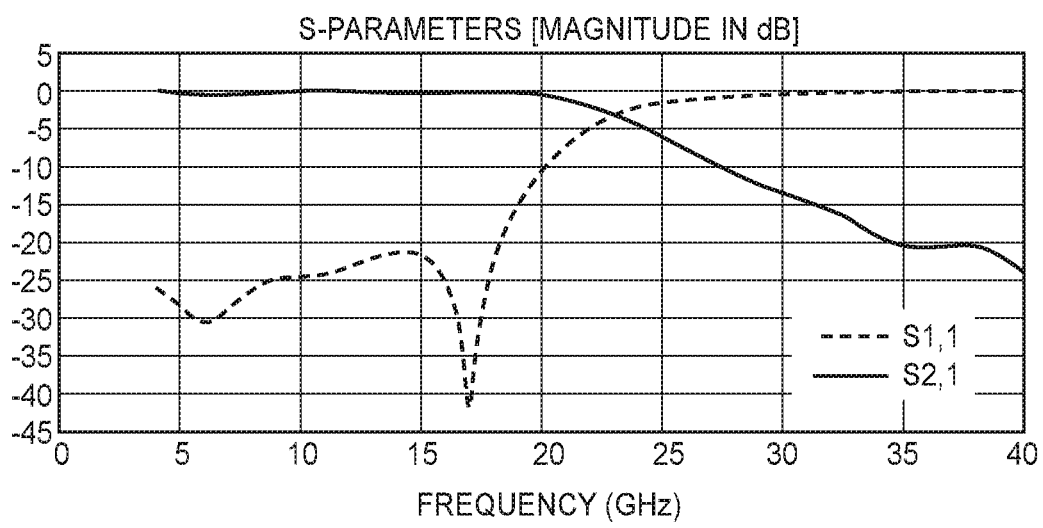
FIG. 3B is a scattering parameters plot (S-parameters) for an antenna structure that includes the filter element of FIG. 3A.

FIG. 3B is a scattering parameters plot (S-parameters) for an antenna structure that includes the filter element 66 of FIG. 3A. The S-parameter magnitude is plotted in decibels (dB) across a GHz frequency range. The return loss, or S1,1, is an indication of how much power is reflected from the antenna structure. For frequencies where S1,1 is equal to 0 dB, then substantially all power from a signal is reflected. The insertion loss, or S2,1, is an indication of how much power is transferred by the antenna structure. For frequencies where S2,1 is equal to 0 dB, then substantially all power from a signal is transferred. Accordingly, a pass band may be characterized as up to about 20 GHz and a stop band may characterized as about 25 GHz and above with a crossover or transition band in between.

Figure 4A:
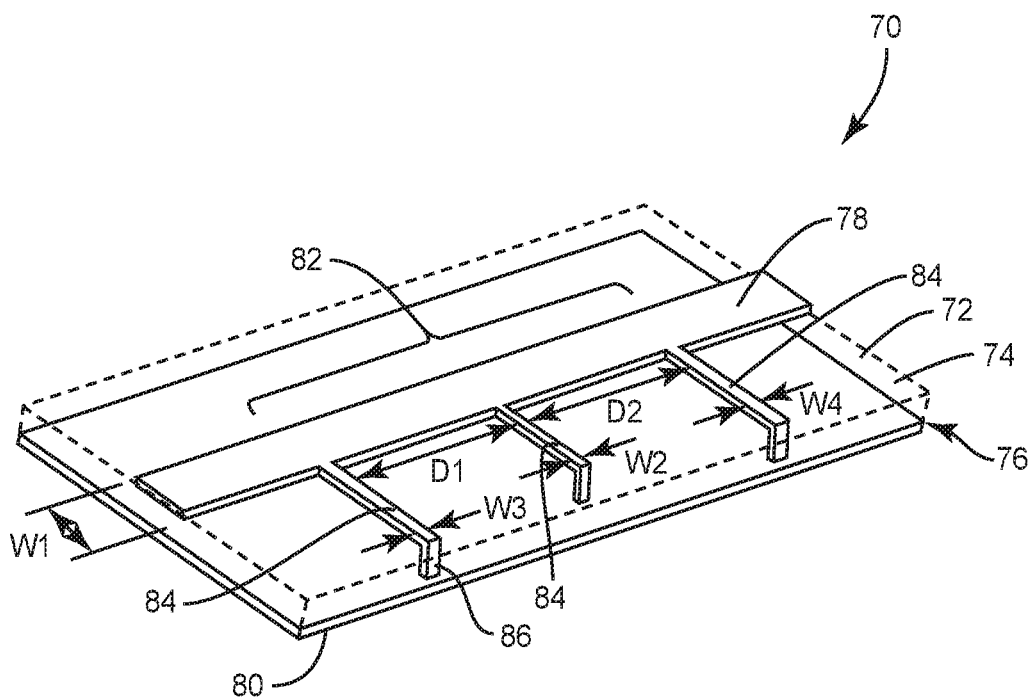
FIG. 4A is a perspective view of a portion of an antenna structure according to some embodiments.

FIG. 4A is a perspective view of a portion of an antenna structure 70 according to some embodiments. It is understood the portion of the antenna structure 70 may be either a portion of an input antenna structure or a portion of an output antenna structure of an amplifier assembly. The portion of the antenna structure 70 includes a board 72 as previously described that includes a first face 74 and a second face 76 that generally opposes the first face 74. A signal conductor 78 is on the first face 74 and a ground conductor 80 is on the second face 76. A filter element 82 is an integral single component with the signal conductor 78. The filter element 82 includes a plurality of stubs 84 that are continuous with and protrude from the signal conductor 78 along the first face 74. The plurality of stubs 84 are configured to attenuate frequencies outside of a desired operating range. As previously described, the length, width, height, spacing, position, and number of stubs 84 are configured to reflect or absorb unwanted frequencies propagating through the signal conductor 78. The plurality of stubs 84 are configured to be a high-pass filter and extend along the first face 74 in one direction from the signal conductor 78. The plurality of stubs 84 extend perpendicular and in the same direction from the signal conductor 78. In some embodiments, the plurality of stubs 84 extend in different lengths. In one example, the plurality of stubs 84 include at least three stubs 84, and a middle stub 84 of the at least three stubs 84 has a lesser length than the other two stubs 84. Depending on the frequencies intended to be filtered, the plurality of stubs 84 may additionally include one or more stub vias 86 that extend to and electrically couple with the ground conductor 80. The one or more stub vias 86 may extend through the board 72 from the first face 74 and electrically couple the plurality of stubs 84 to the ground conductor 80 on the second face 76. In such embodiments, the filter element 82 is electrically coupled or shorted to the ground conductor 80. The one or more stub vias 86 may be an integral single component with the plurality of stubs 84, or the one or more stub vias 86 may be a separate component that is electrically connected to the plurality of stubs 84. The ground conductor 80 may be an input ground conductor or an output ground conductor depending whether the antenna structure 70 is configured as an input antenna structure or an output antenna structure.

By way of a non-limiting example, the antenna structure 70 of FIG. 4A has a width (W1) of about 23-25 mil for the signal conductor 78. The stubs 84 have widths of about 2-3 mil (W2) and about 4-6 mil (W3, W4) respectively, and are spaced apart by a distance of about 61-63 mil (D1, D2). Accordingly, the widths (W2, W3, and W4) of the stubs 84 of the signal conductor 78 are smaller than the width (W1) of the rest of the signal conductor 78.

Figure 4B:
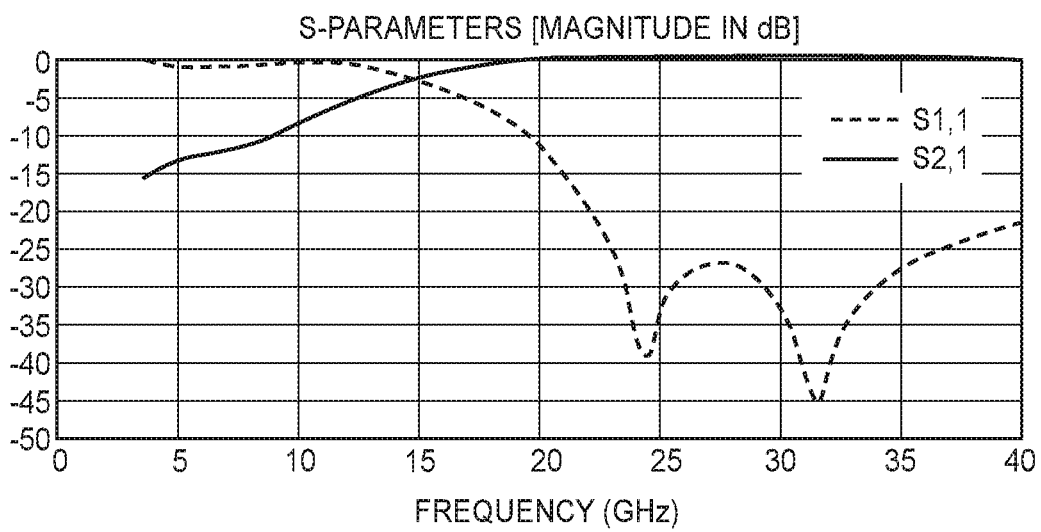
FIG. 4B is a scattering parameters plot (S-parameters) for an antenna structure that includes the filter element of FIG. 4A.

FIG. 4B is a scattering parameters plot (S-parameters) for an antenna structure that includes the filter element 82 of FIG. 4A. The S-parameter magnitude is plotted in dB across a GHz frequency range for return loss, or S1,1, and insertion loss, or S2,1. Accordingly, a pass band may be characterized as about 20 GHz and above while a stop band may be characterized as about 15 GHz and below with a crossover or transition band in between.

Spatial power-combining devices may include various combinations of filter elements including low-pass filters, high-pass filters, band-pass filters, band-stop filters, and combinations thereof. In some aspects, the filter element is configured as an integral single component with an input signal conductor, an output signal conductor, or both the input signal conductor and the output signal conductor of an amplifier assembly.

Figure 5A:
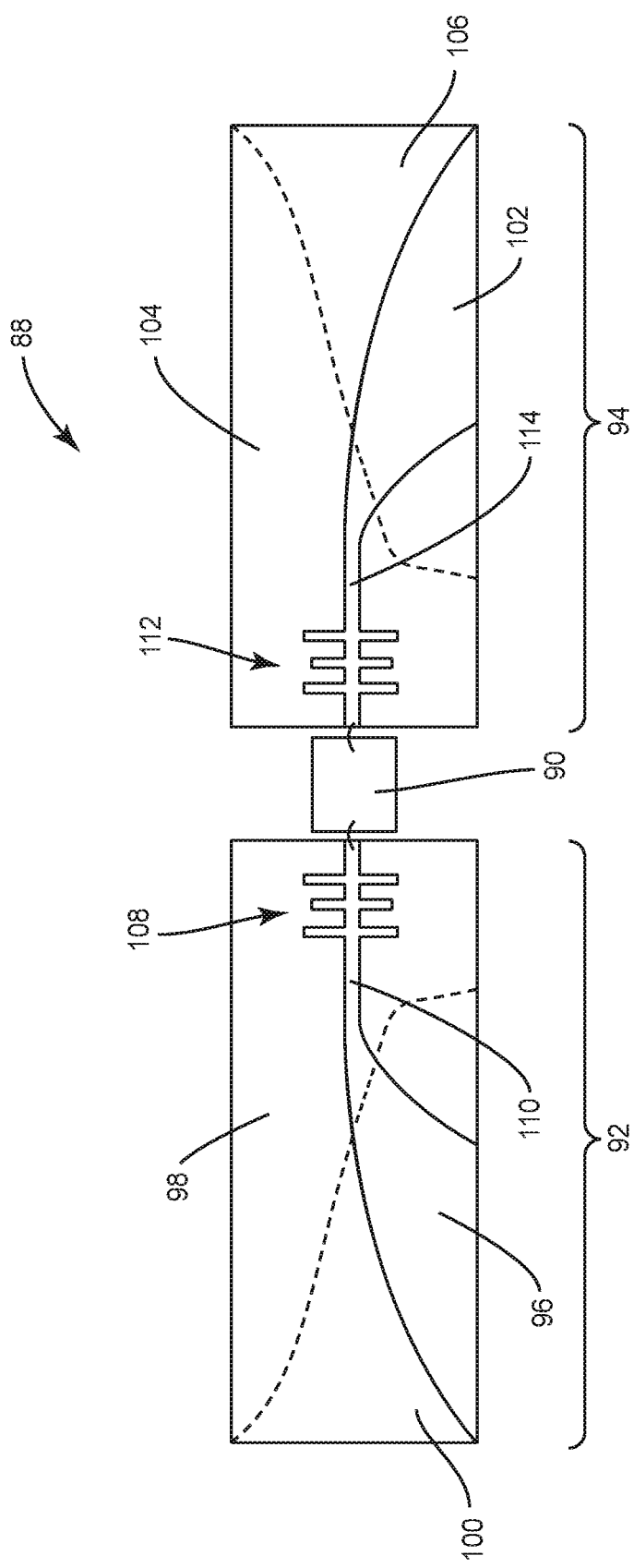
FIG. 5A is a plan view of an amplifier sub-assembly according to some embodiments.

In that regard, FIG. 5A is a plan view of an amplifier sub-assembly 88 according to some embodiments. The amplifier sub-assembly 88 includes an amplifier 90 and an input antenna structure 92 and an output antenna structure 94 that are both coupled to the amplifier 90. The input antenna structure 92 includes an input signal conductor 96 and an input ground conductor 98 on opposing faces of a first board 100. The first board 100 is represented as transparent in FIG. 5A in order for the input ground conductor 98 to be visible. However, it is understood the first board 100 may not be transparent and, accordingly, the input ground conductor 98 may not be visible through the first board 100. The output antenna structure 94 includes an output signal conductor 102 and an output ground conductor 104 on opposing faces of a second board 106. In some embodiments, the first board 100 and the second board 106 may be a single continuous board. In some embodiments, a first filter element 108 is an integral single component with the input signal conductor 96. The input signal conductor 96 comprises an input signal connector portion 110 that is coupled to the amplifier 90, and the input signal connector portion 110 comprises the first filter element 108. In further embodiments, a second filter element 112 is an integral single component with the output signal conductor 102. The output signal conductor 102 comprises an output signal connector portion 114 that is coupled to the amplifier 90, and the output signal connector portion 114 comprises the second filter element 112. In some embodiments, the first filter element 108 and the second filter element 112 are configured to attenuate a same frequency range. For example, the first filter element 108 and the second filter element 112 may both be a low-pass filter, a high-pass filter, a band-pass filter, or a band-stop filter. For a specific embodiment, the first filter element 108 and the second filter element 112 both comprise a low-pass filter.

Figure 5B:
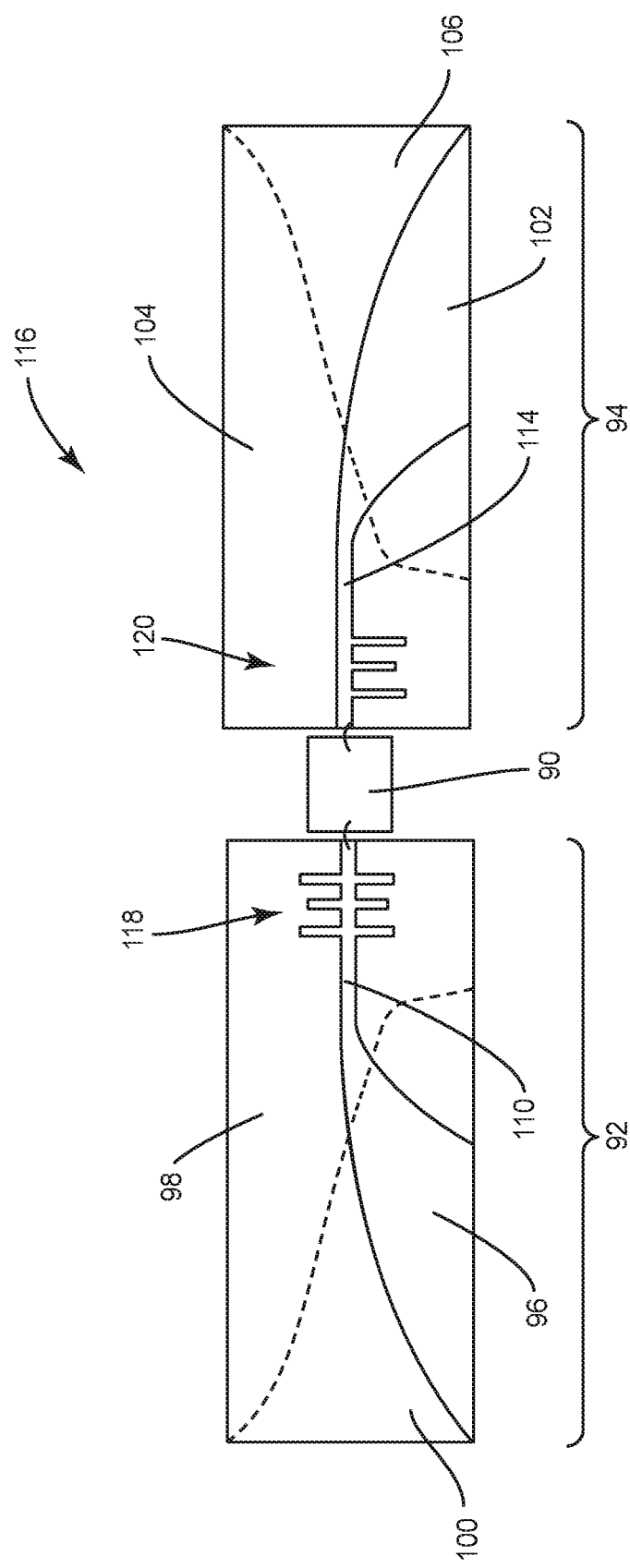
FIG. 5B is a plan view of an amplifier sub-assembly according to some embodiments.

In other embodiments, an amplifier sub-assembly includes at least two filter elements that filter different frequency bands. In that regard, FIG. 5B is a plan view of an amplifier sub-assembly 116 according to some embodiments.

The amplifier sub-assembly 116 includes the amplifier 90, the input antenna structure 92, the output antenna structure 94, the input signal conductor 96, the input ground conductor 98, the first board 100, the output signal conductor 102, the output ground conductor 104, the second board 106, the input signal connector portion 110, and the output signal connector portion 114, as previously described. A first filter element 118 is an integral single component with the input signal conductor 96, and a second filter element 120 is an integral single component with the output signal conductor 102. In some embodiments, the first filter element 118 and the second filter element 120 are configured to attenuate a different frequency range. For example, the first filter element 118 and the second filter element 120 may comprise different ones of a low-pass filter, a high-pass filter, a band-pass filter, and a band-stop filter. For a specific embodiment, the first filter element 118 is a low-pass filter, and the second filter element 120 is a high-pass filter.

Figure 5C:
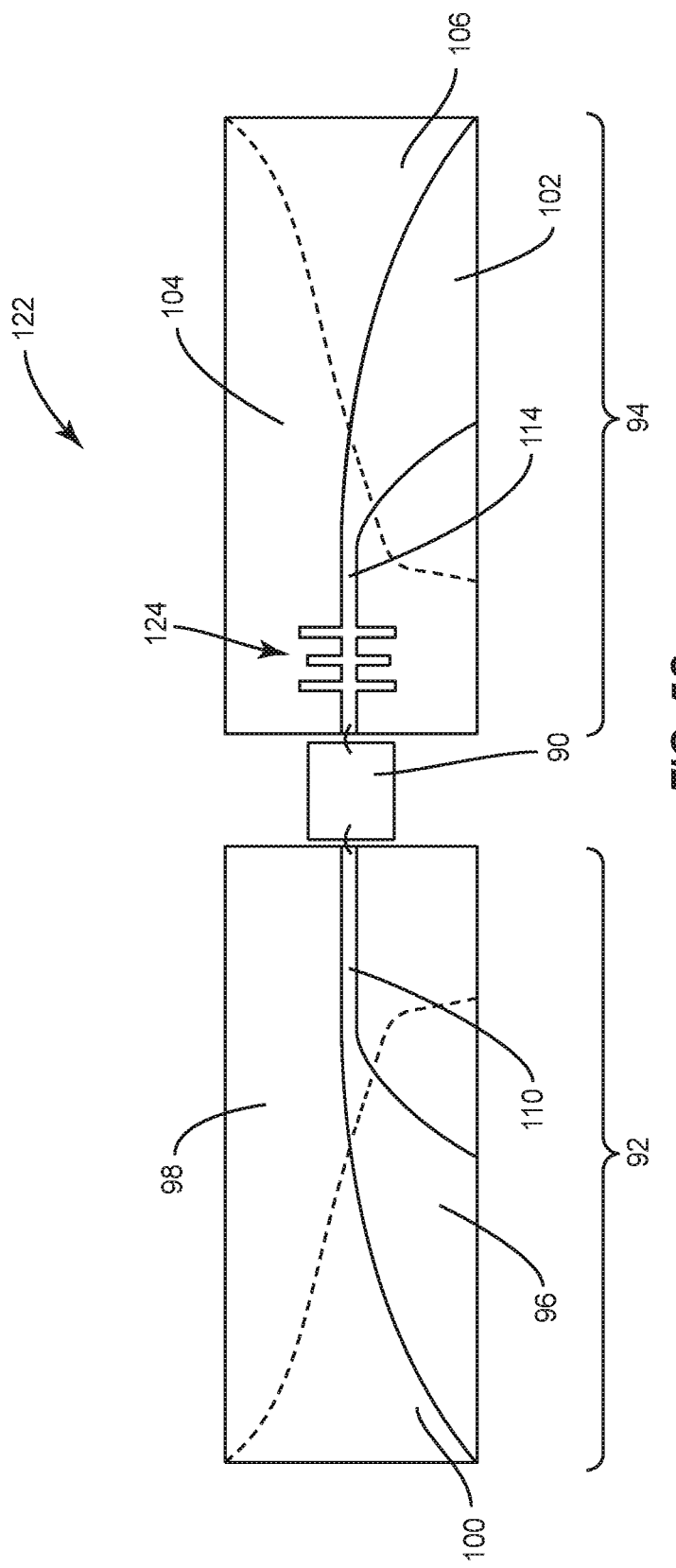
FIG. 5C is a plan view of an amplifier sub-assembly according to some embodiments.

In other embodiments, an amplifier sub-assembly may only include a filter element with the output antenna structure. In that regard, FIG. 5C is a plan view of an amplifier sub-assembly 122 according to some embodiments. The amplifier sub-assembly 122 includes the amplifier 90, the input antenna structure 92, the output antenna structure 94, the input signal conductor 96, the input ground conductor 98, the first board 100, the output signal conductor 102, the output ground conductor 104, the second board 106, the input signal connector portion 110, and the output signal connector portion 114, as previously described. A first filter element 124 is an integral single component with the output signal conductor 102, and the first filter element 124 may be a low-pass filter, a high-pass filter, a band-pass filter, or a band-stop filter.

In other embodiments, an amplifier sub-assembly may include a filter element that is an integral single component with a signal conductor of an antenna structure and is additionally electrically coupled to a ground conductor of an antenna structure. In that regard, FIG. 5D is a plan view of an amplifier sub-assembly 126 according to some embodiments. The amplifier sub-assembly 126 includes the amplifier 90, the input antenna structure 92, the output antenna structure 94, the input signal conductor 96, the input ground conductor 98, the first board 100, the output signal conductor 102, the output ground conductor 104, the second board 106, the input signal connector portion 110, and the output signal connector portion 114, as previously described. A first filter element 128 and a second filter element 130 may be configured similar to the filter element 82 of FIG. 4A. Accordingly, the first filter element 128 is an integral single component with the input signal conductor 96 and is electrically coupled with the input ground conductor 98, and the second filter element 130 is an integral single component with the output signal conductor 102 and is electrically coupled with the output ground conductor 104. In one embodiment, the first filter element 128 and the second filter element 130 are high-pass filters. In some embodiments, the amplifier sub-assembly 126 comprises both the first filter element 128 and the second filter element 130 while in other embodiments, the amplifier sub-assembly 126 comprises only one of the first filter element 128 and the second filter element 130.

Figure 5E:
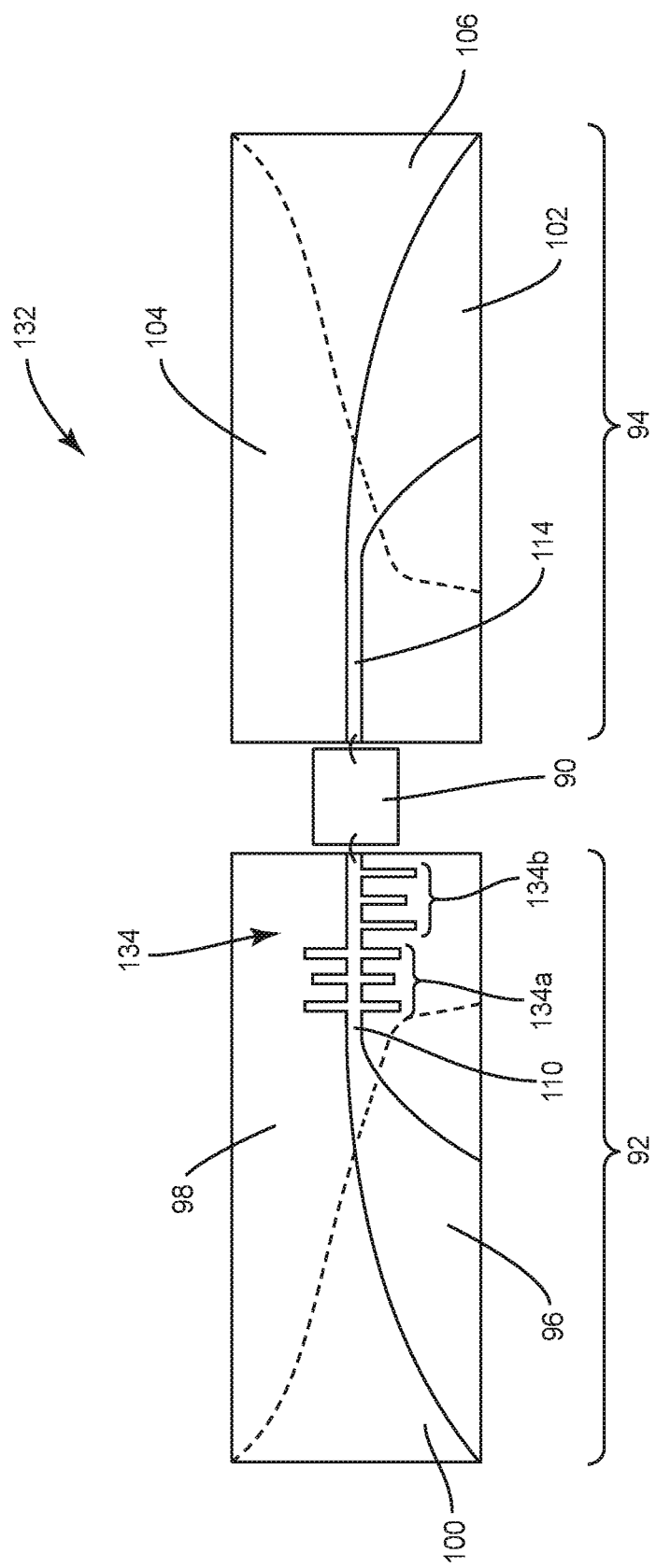
FIG. 5E is a plan view of an amplifier sub-assembly according to some embodiments.

In other embodiments, an amplifier sub-assembly may include a filter element that is configured to attenuate a plurality of frequency ranges. In that regard, FIG. 5E is a plan view of an amplifier sub-assembly 132 according to some embodiments. The amplifier sub-assembly 132 includes the amplifier 90, the input antenna structure 92, the output antenna structure 94, the input signal conductor 96, the input ground conductor 98, the first board 100, the output signal conductor 102, the output ground conductor 104, the second board 106, the input signal connector portion 110, and the output signal connector portion 114, as previously described. A first filter element 134 is an integral single component with the input signal conductor 96. The first filter element 134 includes a first pattern 134a configured to attenuate a first frequency range and a second pattern 134b configured to attenuate a second frequency range that is different than the first. For example, the first pattern 134a may be a low-pass filter, and the second pattern 134b may be a high-pass filter. In other embodiments, other combinations of filters may be included.

In some embodiments, a spatial power-combining device includes a plurality of amplifier assemblies, and each amplifier assembly includes more than one amplifier sub-assembly. Accordingly, each amplifier assembly includes a plurality of amplifiers that are coupled to a plurality of antennas and, in this manner, the output power of a spatial power-combining device is increased. In some embodiments, at least one filter element is configured with each amplifier sub-assembly.

Figure 6:
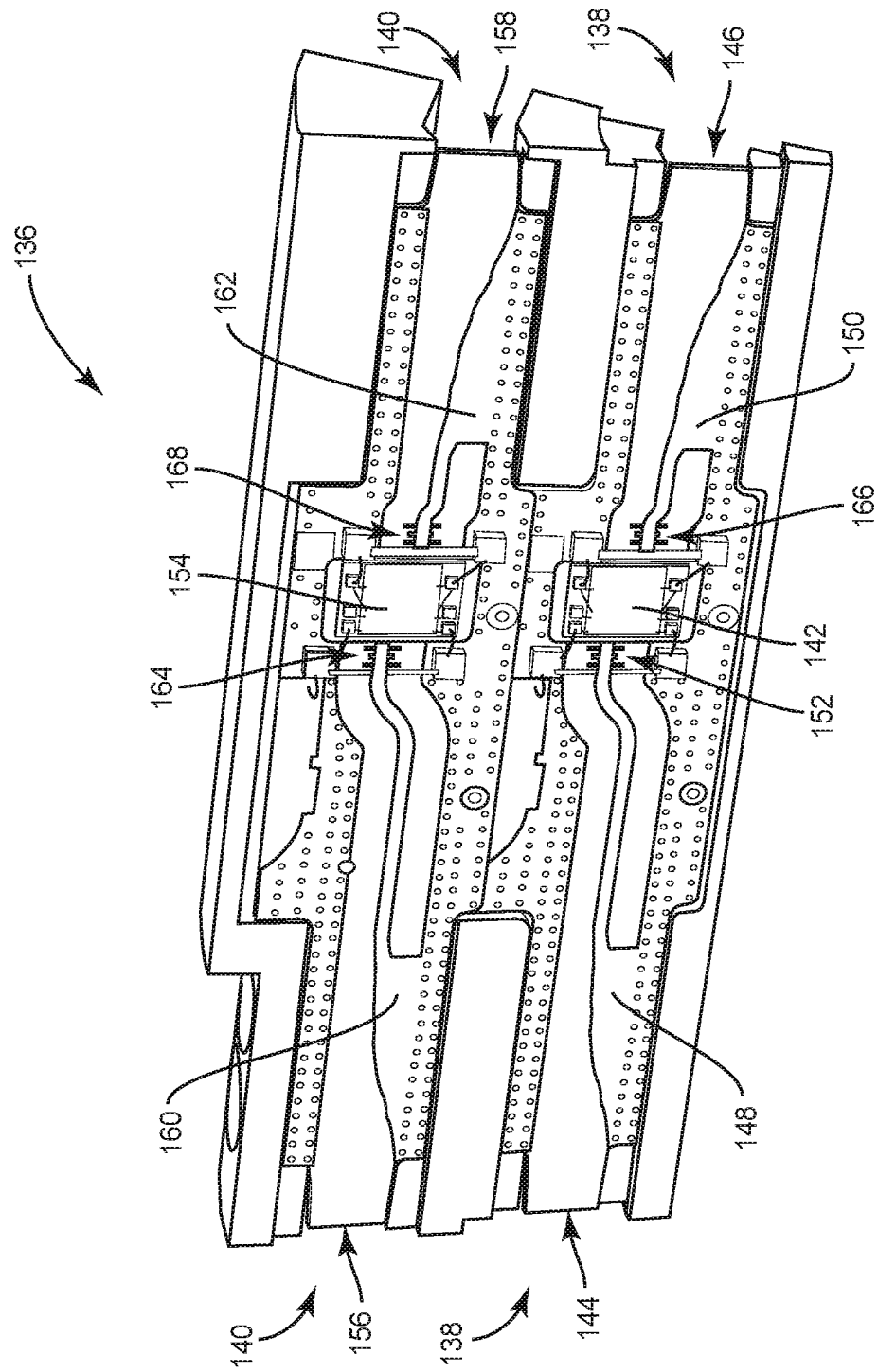
FIG. 6 is a perspective view of an amplifier assembly according to some embodiments.

In that regard, FIG. 6 is a perspective view of an amplifier assembly 136 according to some embodiments. The amplifier assembly 136 comprises a first amplifier sub-assembly 138 and a second amplifier sub-assembly 140. The first amplifier sub-assembly 138 comprises a first amplifier 142, a first input antenna structure 144 coupled to the first amplifier 142, and a first output antenna structure 146 coupled to the first amplifier 142. The first input antenna structure 144 comprises a first input signal conductor 148, and the first output antenna structure 146 comprises a first output signal conductor 150. A first filter element 152 is an integral single component with the first input signal conductor 148. The second amplifier sub-assembly 140 comprises a second amplifier 154, a second input antenna structure 156 coupled to the second amplifier 154, and a second output antenna structure 158 coupled to the second amplifier 154. The second input antenna structure 156 comprises a second input signal conductor 160, and the second output antenna structure 158 comprises a second output signal conductor 162. A second filter element 164 is an integral single component with the second input signal conductor 160. In further embodiments, a third filter element 166 is an integral single component with the first output signal conductor 150, and a fourth filter element 168 is an integral single component with the second output signal conductor 162. The first filter element 152, the second filter element 164, the third filter element 166, and the fourth filter element 168 may be configured similar to any of the previously described embodiments and may comprise at least one of a low-pass filter, a high-pass filter, a band-pass filter, and a band-stop filter. In some embodiments, the third filter element 166 and the fourth filter element 168 may be omitted while, in other embodiments, the first filter element 152 and the second filter element 164 may be omitted.

In this regard, the first amplifier sub-assembly 138 and the second amplifier sub-assembly 140 are separate signal paths for the first amplifier 142 and the second amplifier 154, respectively, and each signal path is configured with at least one filter element. The first amplifier 142 comprises a first MMIC amplifier, and the second amplifier 154 comprises a second MMIC amplifier.

In some embodiments, the amplifier assembly 136 may replace each amplifier assembly 18 of the plurality of amplifier assemblies 18 in the spatial power-combining device 10 of FIG. 1. In this regard, the input coaxial waveguide section (14 in FIG. 1) is configured to concurrently provide a signal to the first input antenna structure 144 and the second input antenna structure 156 of each amplifier assembly 136 of the plurality of amplifier assemblies 136. The output coaxial waveguide section (26 in FIG. 1) is configured to concurrently combine a signal from the first output antenna structure 146 and the second output antenna structure 158 of each amplifier assembly 136 of the plurality of amplifier assemblies 136.

In some embodiments, a spatial power-combining device includes a plurality of amplifier assemblies, and each amplifier assembly includes an antenna structure that is not supported on a board. For example, the antenna structure includes a signal conductor and a ground conductor with a metal that is thick enough to not require a supporting board or substrate. In this configuration, the signal conductor and the ground conductor are separated by air.

Figure 7:
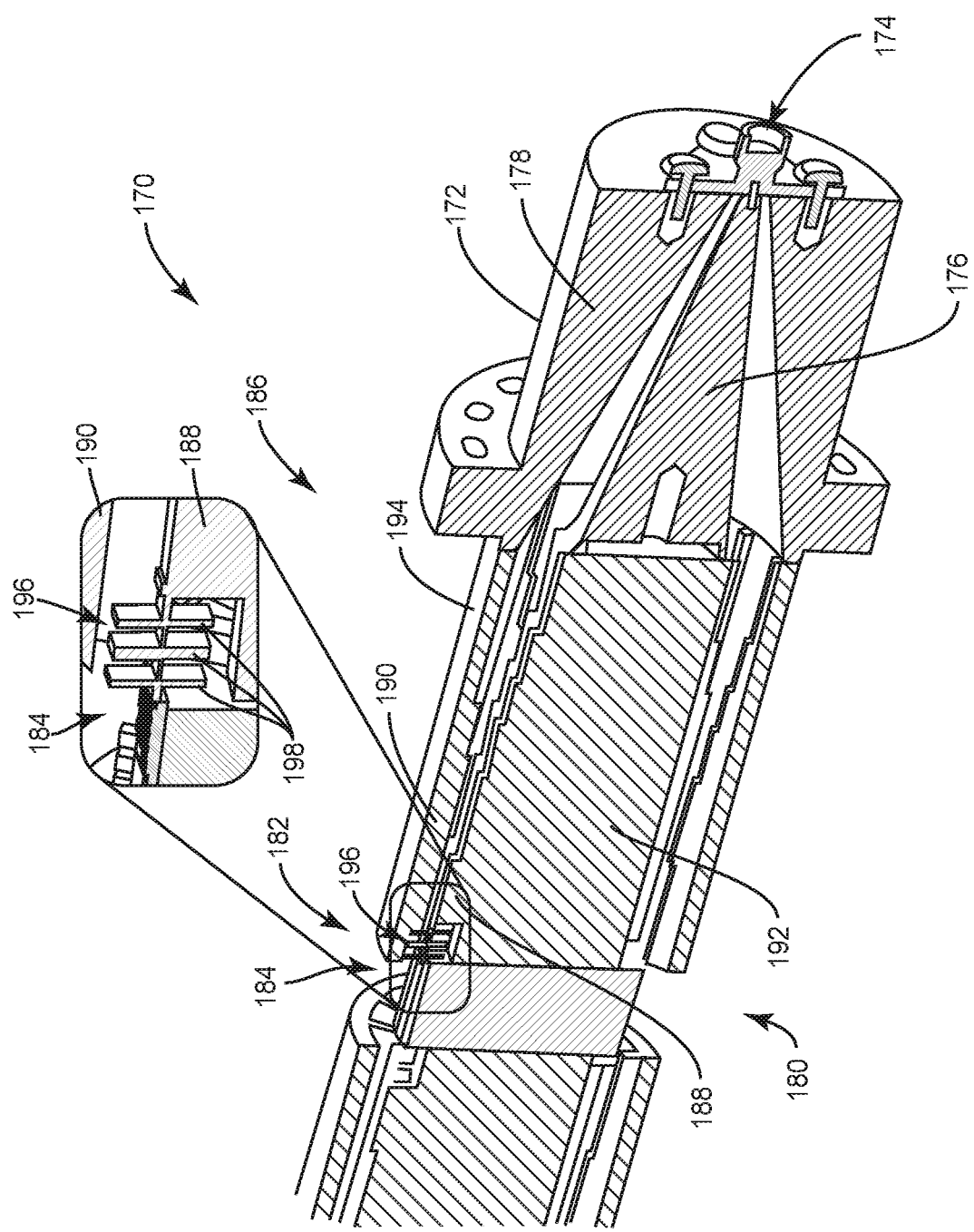
FIG. 7 is a partial cross-sectional view of a spatial power-combining device according to some embodiments.

In this regard, FIG. 7 is a partial cross-sectional view of a spatial power-combining device 170 according to some embodiments. The spatial power-combining device 170 includes a coaxial waveguide section 172 and a port 174. The coaxial waveguide section 172 comprises an inner conductor 176 and an outer conductor 178 with gradually changing profiles configured to reduce an impedance mismatch from the port 174 and a center waveguide section 180. The coaxial waveguide section 172 and the port 174 may be either an input coaxial waveguide section and an input port or an output coaxial waveguide section and an output port. The center waveguide section 180 comprises an amplifier assembly 182 that comprises an amplifier 184 and an antenna structure 186 comprising a signal conductor 188 and a ground conductor 190 that are separated by air. The spatial power-combining device 170 further includes an inner housing 192 that includes the signal conductor 188 and an outer housing 194 that includes the ground conductor 190. The signal conductor 188 and the inner housing 192 are an integral single element, and the ground conductor 190 and the outer housing 194 are an integral single element. A first filter element 196 is an integral single component with the signal conductor 188. The first filter element 196 comprises at least one of a low-pass filter, a high-pass filter, a band-pass filter, and a band-stop filter.

The first filter element 196 is an integral single component with the signal conductor 188, and the signal conductor 188 and the ground conductor 190 are separated by air. The signal conductor 188 is coupled to the amplifier 184. The first filter element 196 includes a plurality of stubs 198 as previously described. If the first filter element 196 is configured similar to FIG. 3A, then the signal conductor 188 and the ground conductor 190 are completely separated by air. If the first filter element 196 is configured similar to FIG. 4A, then the signal conductor 188 and the ground conductor 190 are separated by air, except for portions of the plurality of stubs 198 that are electrically coupled to the ground conductor 190.

It is understood the description of FIG. 7 would apply to one or both of an input antenna structure and an output antenna structure. In that regard, a spatial power-combining device for modifying a signal comprises an amplifier assembly that comprise an amplifier, an input antenna structure comprising an input signal conductor and an input ground conductor that are separated by air, an output antenna structure comprising an output signal conductor and an output ground conductor that are separated by air, and a first filter element that is an integral single component with at least one of the input signal conductor and the output signal conductor. In further embodiments, the spatial power-combining device comprises an outer housing comprising the input ground conductor of each amplifier assembly and an inner housing comprising the input signal of each amplifier assembly. In further embodiments, the outer housing and the input ground conductor are an integral single element, and in still further embodiments, the inner housing and the input signal conductor are an integral single element.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising a plurality of amplifier assemblies, wherein each amplifier assembly of the plurality of amplifier assemblies comprises:
   an amplifier;
   an input antenna structure comprising an input signal conductor and an input ground conductor;
   an output antenna structure comprising an output signal conductor and an output ground conductor; and
   a first filter element that is electrically coupled to at least one of the input signal conductor and the output signal conductor.

2. The spatial power-combining device of claim 1 further comprising:
   an input coaxial waveguide section configured to concurrently provide an input signal to the input antenna structure of each amplifier assembly of the plurality of amplifier assemblies; and
   an output coaxial waveguide section configured to concurrently combine an amplified output signal from the output antenna structure of each amplifier assembly of the plurality of amplifier assemblies.

3. The spatial power-combining device of claim 1 wherein the first filter element comprises at least one of a low-pass filter, a high-pass filter, a band-pass filter, and a band-stop filter.

4. The spatial power-combining device of claim 1 wherein the first filter element comprises a plurality of stubs configured to attenuate one or more frequencies.

5. The spatial power-combining device of claim 4 wherein a length of each stub of the plurality of stubs is equal to a quarter wavelength of the frequency each stub is configured to attenuate.

6. The spatial power-combining device of claim 4 wherein each stub of the plurality of stubs is spaced from another stub of the plurality of stubs by a distance equal to a quarter wavelength of the frequency each stub is configured to attenuate.

7. The spatial power-combining device of claim 4 wherein a longitudinal axis of each stub of the plurality of stubs extends perpendicular to at least one of the input signal conductor and the output signal conductor.

8. The spatial power-combining device of claim 7 wherein the plurality of stubs extend perpendicular and in at least two directions from at least one of the input signal conductor and the output signal conductor.

9. The spatial power-combining device of claim 7 wherein the plurality of stubs extend perpendicular and in the same direction from at least one of the input signal conductor and the output signal conductor.

10. The spatial power-combining device of claim 7 wherein the plurality of stubs comprise at least three stubs and a middle stub of the at least three stubs comprises lesser length than the other two stubs.

11. The spatial power-combining device of claim 1 wherein the input antenna structure further comprises:
   a substrate comprising a first face and a second face that opposes the first face;
   wherein the input signal conductor is on the first face and the input ground conductor is on the second face.

12. The spatial power-combining device of claim 11 wherein the first filter element is an integral single component with the input signal conductor and the first filter element is electrically coupled to the input ground conductor.

13. The spatial power-combining device of claim 12 wherein the first filter element comprises:
- a plurality of stubs configured to attenuate one or more frequencies; and
- one or more stub vias that extend from the first face and electrically couple the plurality of stubs to the input ground conductor on the second face.

14. The spatial power-combining device of claim 1 wherein the first filter element is an integral single component with the input signal conductor.

15. The spatial power-combining device of claim 14 further comprising a second filter element that is an integral single component with the output signal conductor.

16. The spatial power-combining device of claim 15 wherein the first filter element is configured to attenuate a different frequency range than the second filter element.

17. The spatial power-combining device of claim 1 wherein the input signal conductor comprises:
- an input signal connector portion that is coupled to the amplifier;
- wherein the input signal connector portion comprises the first filter element.

18. The spatial power-combining device of claim 1 wherein the first filter element is an integral single component with the output signal conductor.

19. The spatial power-combining device of claim 1 wherein the output signal conductor comprises:
- an output signal connector portion that is coupled to the amplifier;
- wherein the output signal connector portion comprises the first filter element.

20. A spatial power-combining device comprising a plurality of amplifier assemblies, wherein each amplifier assembly of the plurality of amplifier assemblies comprises:
- a first amplifier sub-assembly comprising:
  - a first amplifier;
  - a first input antenna structure coupled to the first amplifier and comprising a first input signal conductor;
  - a first output antenna structure coupled to the first amplifier; and
  - a first filter element that is electrically coupled to the first input signal conductor; and
- a second amplifier sub-assembly comprising:
  - a second amplifier;
  - a second input antenna structure coupled to the second amplifier and comprising a second input signal conductor;
  - a second output antenna structure coupled to the second amplifier; and
  - a second filter element that is electrically coupled to the second input signal conductor.

21. The spatial power-combining device of claim 20 further comprising:
- an input coaxial waveguide section configured to concurrently provide an input signal to the first input antenna structure and the second input antenna structure of each amplifier assembly of the plurality of amplifier assemblies; and
- an output coaxial waveguide section configured to concurrently combine an amplified output signal from the first output antenna structure and the second output antenna structure of each amplifier assembly of the plurality of amplifier assemblies.

22. A spatial power-combining device for modifying a signal comprising an amplifier assembly, wherein the amplifier assembly comprises:
- an amplifier;
- an input antenna structure comprising an input signal conductor and an input ground conductor that are separated by air;
- an output antenna structure comprising an output signal conductor and an output ground conductor that are separated by air; and
- a first filter element that is electrically coupled to at least one of the input signal conductor and the output signal conductor.

23. The spatial power-combining device of claim 22 further comprising:
- an outer housing comprising the input ground conductor; and
- an inner housing comprising the input signal conductor.

* * * * *